(12) United States Patent
Miyakawa et al.

(10) Patent No.: US 9,646,667 B2
(45) Date of Patent: May 9, 2017

(54) SEMICONDUCTOR MEMORY DEVICE

(71) Applicant: KABUSHIKI KAISHA TOSHIBA, Minato-ku, Tokyo (JP)

(72) Inventors: Tadashi Miyakawa, Kanagawa (JP); Katsuhiko Hoya, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/065,550

(22) Filed: Mar. 9, 2016

(65) Prior Publication Data

US 2017/0062030 A1 Mar. 2, 2017

Related U.S. Application Data

(60) Provisional application No. 62/210,833, filed on Aug. 27, 2015.

(51) Int. Cl.
*G11C 11/00* (2006.01)
*G11C 11/16* (2006.01)

(52) U.S. Cl.
CPC .................. *G11C 11/161* (2013.01)

(58) Field of Classification Search
CPC ........... H01L 27/0688; H01L 27/11519; H01L 27/11565; H01L 27/11578; H01L 27/11582; H01L 27/0207; H01L 21/3086; H01L 21/32139; H01L 27/11521; H01L 27/11524; H01L 27/11526; G11C 11/406; G11C 11/40603; G11C 11/4085; G11C 11/4096; G11C 16/0483; G11C 16/24; G11C 2211/4065

USPC .......... 257/314, E21.662, E21.663, E21.679, 257/E27.103, E21.409, E21.645, E21.081, 257/E29.309, 202, 3, 315, 316, 319, 324, 257/331, 368, 390, 392; 365/222, 63, 365/185.05, 203, 210.15, 230.05; 438/270, 271, 585, 587, 588, 591, 599, 438/631

See application file for complete search history.

(56) References Cited

U.S. PATENT DOCUMENTS

| 2002/0154540 A1 | 10/2002 | Sekiguchi et al. |
| 2004/0141368 A1 | 7/2004 | Inaba |
| 2015/0357376 A1* | 12/2015 | Seo ...................... H01L 27/228 257/252 |

FOREIGN PATENT DOCUMENTS

JP 2004362646 A 12/2004

* cited by examiner

*Primary Examiner* — Thong Q Le
(74) *Attorney, Agent, or Firm* — Holtz, Holtz & Volek PC

(57) ABSTRACT

According to one embodiment, a semiconductor memory device includes: a first active area provided in a semiconductor substrate; a second active area provided in the semiconductor substrate and intersecting with the first active area; a first select transistor comprising a first drain region provided in the first active area and a source region provided in an intersection region of the first and second active areas; a second select transistor comprising a second drain region provided in the second active area and sharing the source region; a word line coupled to gates of the first and second select transistors; and first and second variable resistance elements coupled to the first and second drain regions, respectively.

20 Claims, 11 Drawing Sheets

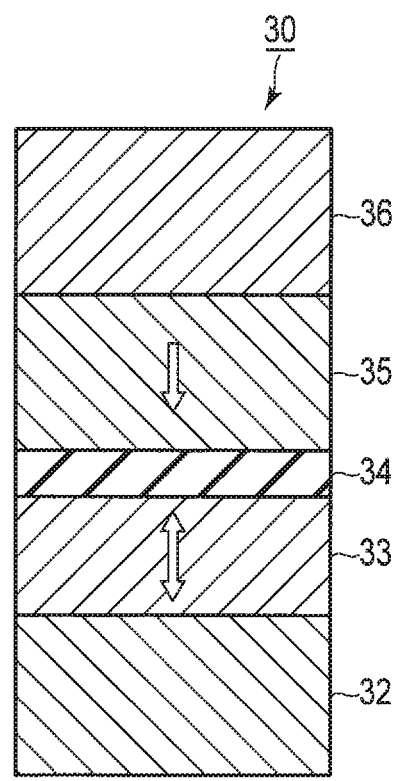
F I G. 3

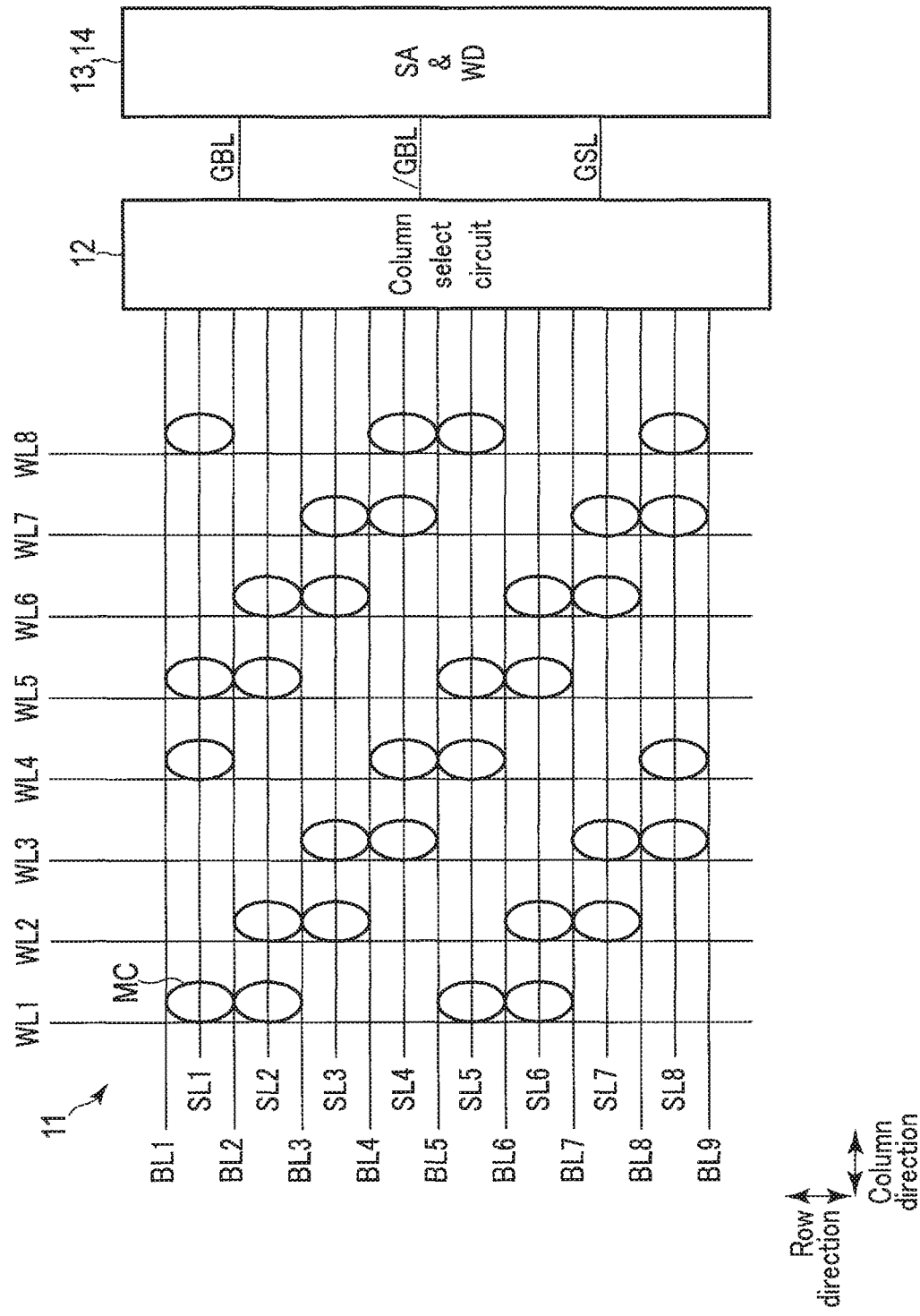
F I G. 4

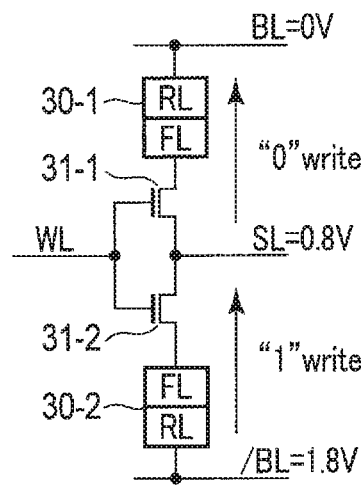
"0" write
F I G. 5A
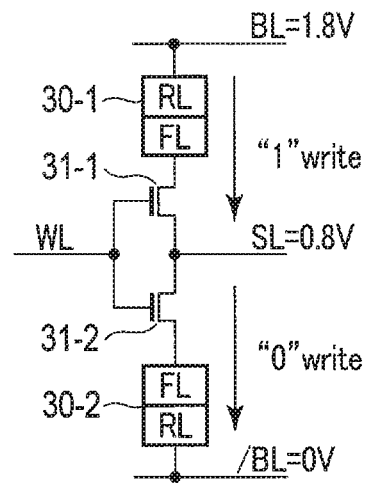
"1" write
F I G. 5B
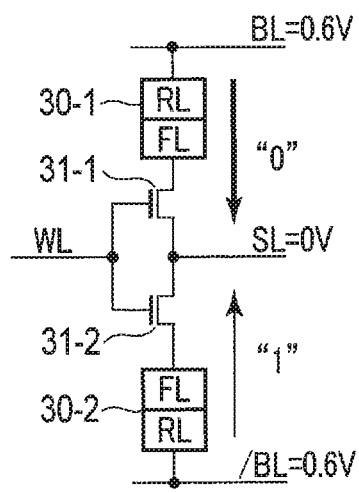
"0" read
F I G. 6A
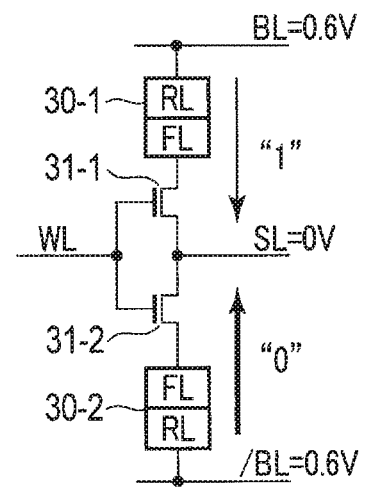
"1" read
F I G. 6B

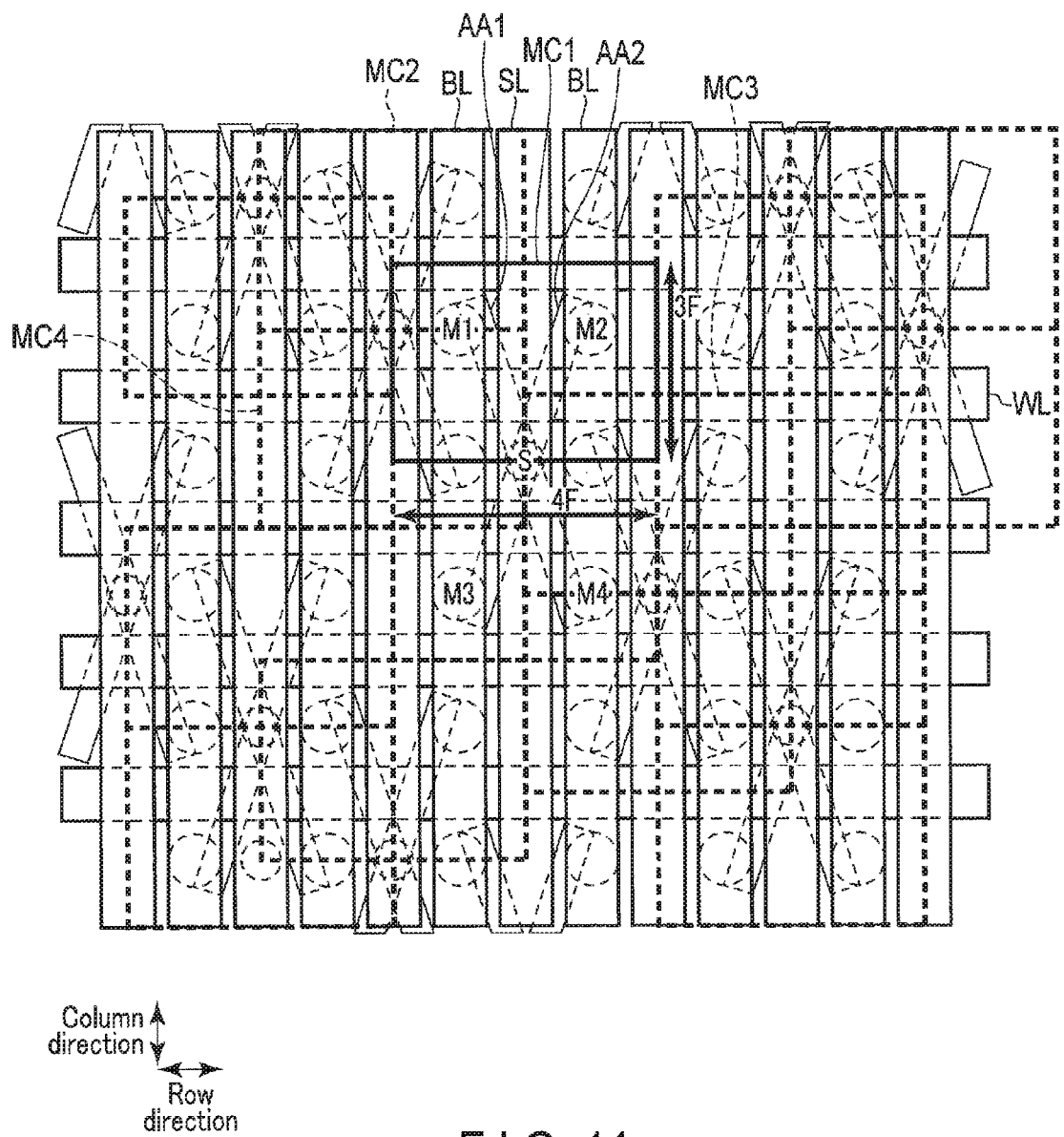
F I G. 11

SEMICONDUCTOR MEMORY DEVICE

CROSS-REFERENCE TO RELATED APPLICATIONS

This application claims the benefit of U.S. Provisional Application No. 62/210,833, filed Aug. 27, 2015, the entire contents of which are incorporated herein by reference.

FIELD

Embodiments described herein relate generally to a semiconductor memory device.

BACKGROUND

A resistance change type memory is known as a kind of semiconductor memory device. Also, as a kind of the resistance change type memory, an MRAM (magnetoresistive random access memory) is known. The MRAM is a memory device using a magnetic element having a magnetoresistive effect for a memory cell that stores information. Writing methods of the MRAM include a magnetic writing method and a spin injection writing method. Among these methods, the spin injection writing method has a property that a spin injection current needed for magnetization reversal decreases with a decreasing size of a magnetic material, making the method advantageous for higher integration, lower power consumption, and higher performance.

An MTJ (Magnetic Tunnel Junction) element as a memory element of the MRAM has a laminated structure including two ferromagnetic layers and a non-magnetic barrier layer sandwiched therebetween and stores digital data based on change of magnetic resistance due to a spin polarization tunnel effect. An MTJ element can take a low-resistance state and a high-resistance state depending on a magnetization relationship of the two ferromagnetic layers.

If the rate of resistance change (MR ratio) is small between the low-resistance state and the high-resistance state, it is difficult to read data correctly from an MTJ element.

BRIEF DESCRIPTION OF THE DRAWINGS

FIG. 3 is a sectional view of an MTJ element;

FIG. 4 is a schematic diagram showing another configuration example of a memory cell array;

FIGS. 5A and 5B are diagrams illustrating a write operation of the memory cell;

FIGS. 6A and 6B are diagrams illustrating a read operation of the memory cell;

FIG. 11 is a plan view of the memory cell array illustrating a cell size; and

DETAILED DESCRIPTION

In general, according to one embodiment, there is provided a semiconductor memory device comprising:

a first active area provided in a semiconductor substrate and extending in a first direction;

a second active area provided in the semiconductor substrate and extending from an end of the first active area in a second direction intersecting the first direction;

a first select transistor comprising a first drain region provided in the first active area and a first source region provided in an intersection region of the first and second active areas;

a second select transistor comprising a second drain region provided in the second active area and sharing the first source region;

a first word line coupled to gates of the first and second select transistors;

first and second variable resistance elements coupled to the first and second drain regions, respectively;

a first bit line coupled to the first variable resistance element;

a second bit line coupled to the second variable resistance element; and a first source line coupled to the first source region.

Hereinafter, an embodiment will be described with reference to the drawings. In the description that follows, the same reference signs are attached to structural elements having substantially the same function and configuration and a duplicate description will be provided only when necessary. The drawings are schematic. Each embodiment exemplifies an apparatus or a method of embodying technical ideas of the embodiment and technical ideas of an embodiment do not limit the materials shapes, structures, arrangements and the like of components to those described below.

In the following embodiment, an MRAM (magnetoresistive random access memory), which is a kind of resistance change type memory, is taken as an example of the semiconductor memory device.

[1] Configuration of Semiconductor Memory Device

Figure 1:
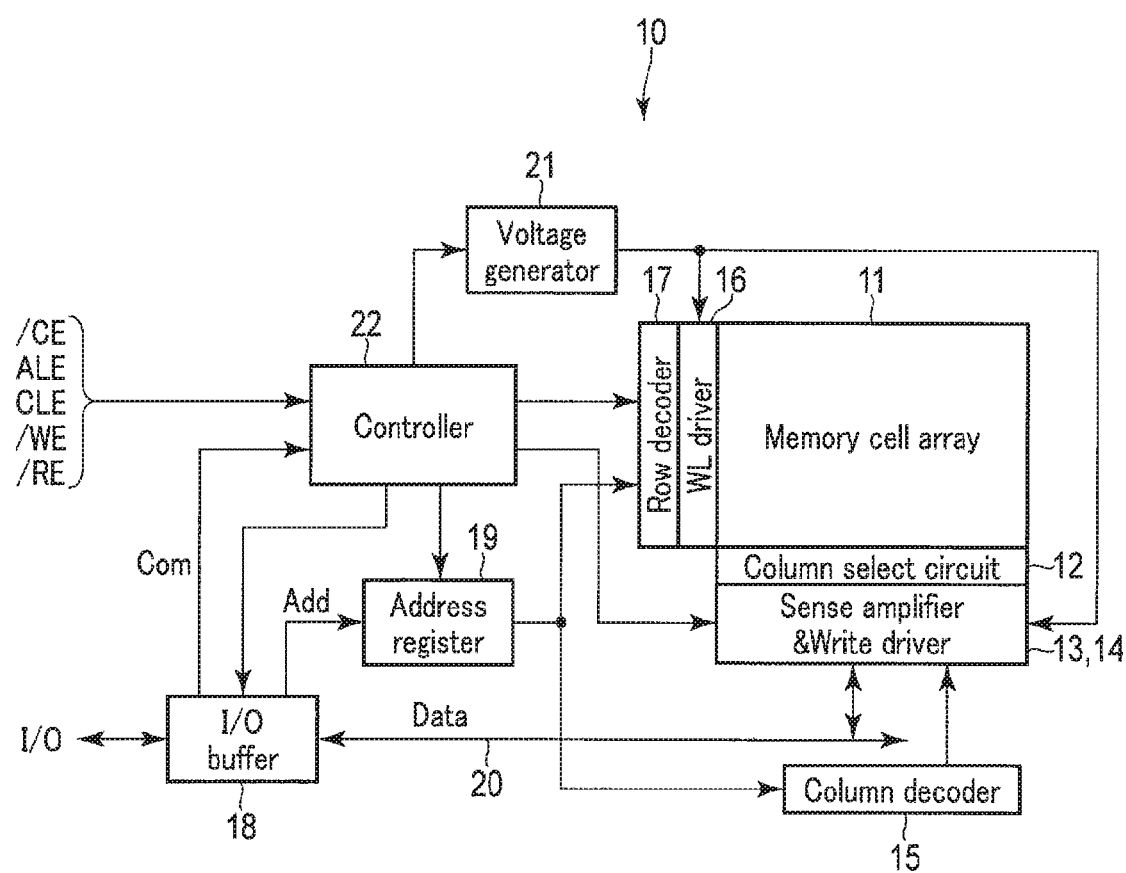
FIG. 1 is a block diagram of a semiconductor memory device according to the present embodiment.

FIG. 1 is a block diagram of a semiconductor memory device 10 according to the present embodiment. A memory cell array 11 comprises a plurality of memory cells MC. Each memory cell MC includes an MTJ (Magnetic Tunnel Junction) element as a memory element. The MTJ element is a magnetoresistive element (magnetoresistive effect element) that stores data based on a change of the resistance state and can rewrite data using, for example, a current. A concrete configuration of the memory cell MC will be described below.

In the memory cell array 11, a plurality of word lines WL extending in a row direction, a plurality of bit lines BL extending in a column direction intersecting the row direction, and a plurality of source lines SL extending in the column direction are provided. The memory cell MC is connected to one word line WL, two bit lines BL, and one source line SL.

A column select circuit 12 is connected to the plurality of bit lines BL and the plurality of source lines SL. The column select circuit 12 selects a column of the memory cell array 11 based on a column selection signal from a column decoder 15.

A sense amplifier 13 and a write driver 14 are connected to the plurality of bit lines BL and the plurality of source lines SL via the column select circuit 12. The sense amplifier 13 reads data stored in a selected memory cell by detecting a current flowing to the selected memory cell. The write driver 14 writes data to a selected memory cell by passing a current to the selected memory cell.

A word line driver (WL driver) 16 is connected to the plurality of word lines WL. The word line driver 16 applies a predetermined voltage to a selected word line based on a row selection signal from a row decoder 17.

The column decoder 15 receives a column address from an address register 19. The column decoder 15 decodes the column address and sends a decode signal (column selection signal) to the column select circuit 12, the sense amplifier 13, and the write driver 14. The row decoder 17 receives a row address from the address register 19. The row decoder 17 decodes the row address and sends a decode signal (row selection signal) to the word line driver 16.

Data is exchanged between the sense amplifier 13 and the write driver 14, and an external input/output terminal I/O via a data bus 20 and an I/O buffer 18.

A controller 22 controls an overall operation of the semiconductor memory device 10. The controller 22 receives various external control signals, for example, a chip enable signal /CE, an address latch enable signal ALE, a command latch enable signal CLE, a write enable signal /WE, and a read enable signal /RE from outside (for example, a host controller).

Based on these external control signals, the controller 22 identifies addresses Add and commands Com supplied from the input/output terminal I/O. Then, the controller 22 transfers the address Add to the column decoder 15 and the row decoder 17 via the address register 19. The controller 22 also decodes the command Com. The controller 22 executes control of each sequence of data reading and data writing according to external control signals and commands.

A voltage generator 21 generates an internal voltage (for example, a voltage stepped up from the power supply voltage) needed for each operation. The voltage generator 21 is controlled by the controller 22 to generate a needed voltage by performing a step-up operation.

[1-1] Configuration of Memory Cell MC

Figure 2:
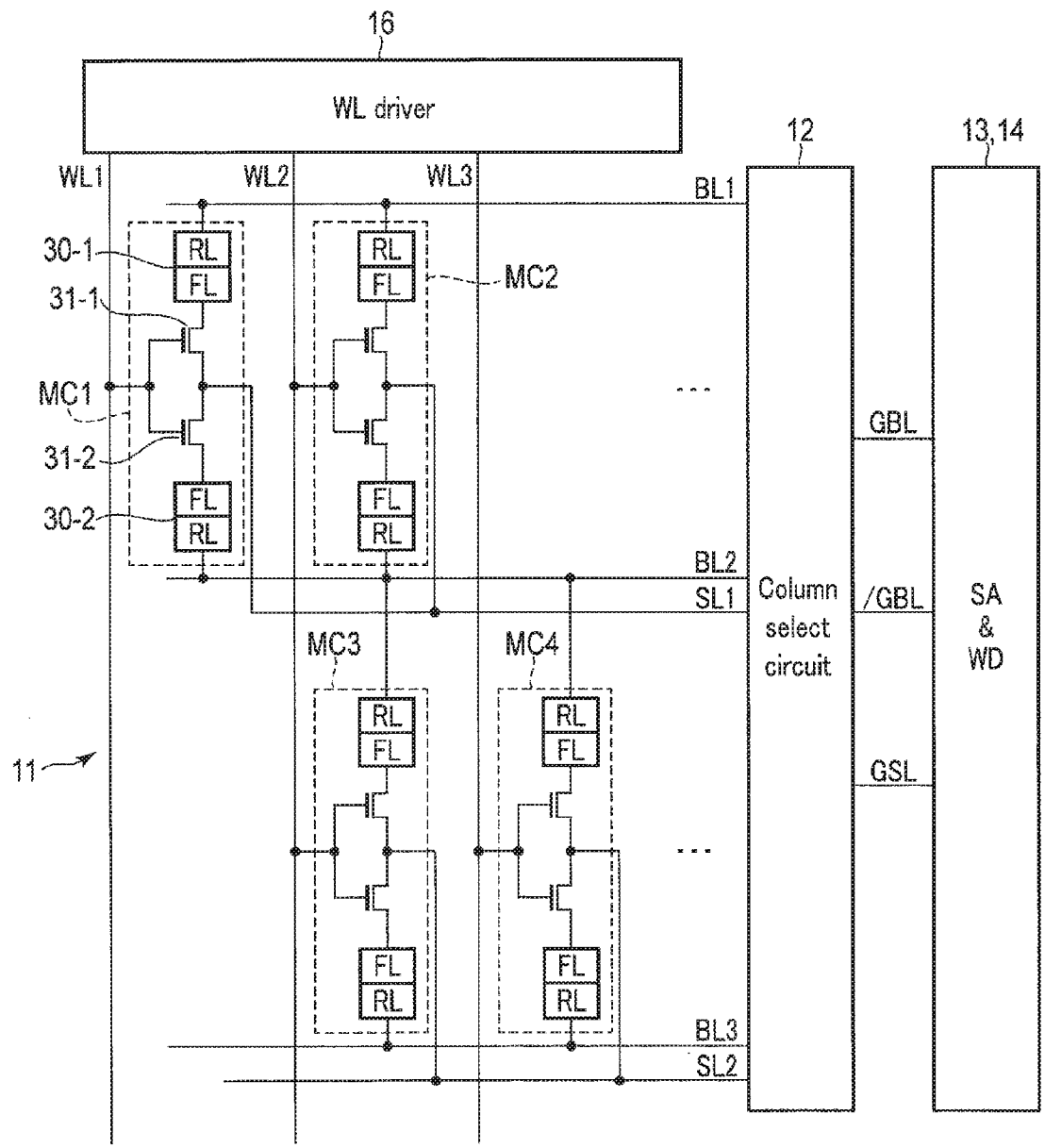
FIG. 2 is a circuit diagram of a memory cell.

Next, the configuration of the memory cell MC will be described. FIG. 2 is a circuit diagram of the memory cell MC. In FIG. 2, four memory cells MC1 to MC4 are extracted and shown. Hereinafter, the circuit configuration will be described by taking the memory cell MC1 as an example.

The memory cell MC1 comprises two MTJ elements 30-1, 30-2 and two select transistors 31-1, 31-2. That is, the memory cell MC1 has a 2MTJ-2Tr structure. The select transistors 31-1, 31-2 are formed of, for example, an N-channel MOS transistor.

One end of the MTJ element 30-1 is connected to a bit line BL1 and the other end thereof is connected to the drain of the select transistor 31-1. The gate of the select transistor 31-1 is connected to a word line WL1 and the source thereof is connected to a source line SL1.

One end of the MTJ element 30-2 is connected to a bit line BL2 and the other end thereof is connected to the drain of the select transistor 31-2. The gate of the select transistor 31-2 is connected to the word line WL1 and the source thereof is connected to the source line SL1.

Next, an example of the structure of an MTJ element 30 will be described. FIG. 3 is a sectional view of the MTJ element 30. The MTJ element 30 is constructed by sequentially stacking a lower electrode 32, a memory layer (free layer) 33, a non-magnetic layer (tunnel barrier layer) 34, a reference layer (fixed layer) 35, and an upper electrode 36. The order of stacking the memory layer 33 and the reference layer 35 may be reversed. In FIG. 2, the memory layer 33 is denoted as "FL" and reference layer 35 is denoted as "RL".

The memory layer 33 and the reference layer 35 are each formed of a ferromagnetic material. The tunnel barrier layer 34 is formed of an insulating material, for example, MgO.

The memory layer 33 and the reference layer 35 each have magnetic anisotropy in, for example, the vertical direction and the easy direction of magnetization thereof is the vertical direction. The magnetic anisotropy in the vertical direction indicates that the magnetization direction is perpendicular or approximately perpendicular to the film surface (top surface/bottom surface). Approximately perpendicular means that the direction of residual magnetization is within the range of 45°<θ≤90° with respect to the film surface. Incidentally, the magnetization direction of the memory layer 33 and the reference layer 35 may be an in-plane direction.

The magnetization direction of the memory layer 33 is variable (may be reversed). That the magnetization direction is variable indicates that the magnetization direction changes with respect to a predetermined write current. The magnetization direction of the reference layer 35 is invariable (fixed). The reference layer 35 is set so as to have vertical magnetic anisotropic energy (or a coercive force) sufficiently larger than that of the memory layer 33. The magnetic anisotropy can be set by adjusting the material, area, and thickness of a magnetic layer. In this manner, a magnetization reversing current of the memory layer 33 is decreased so that the magnetization reversing current of the reference layer 35 becomes larger than that of the memory layer 33. Accordingly, the MTJ element 30 comprising the memory layer 33 whose magnetization direction is variable with respect to the predetermined write current and the reference layer 35 whose magnetization direction is invariable can be realized.

In the present embodiment, the spin injection writing method (spin transfer writing method) by which a write current is passed directly into the MTJ element 30 and the magnetization state of the MTJ element 30 is controlled by the write current is used. The MTJ element 30 can take the low-resistance state and the high-resistance state depending on whether the relative state of magnetization of the memory layer 33 and the reference layer 35 is parallel or anti-parallel. That is, the MTJ element 30 is a variable resistance element.

If a write current from the memory layer 33 toward the reference layer 35 is passed to the MTJ element 30, the relative relation of magnetization of the memory layer 33 and the reference layer 35 becomes parallel. In the parallel state, the resistance value of the MTJ element 30 is the lowest and the MTJ element 30 is set to the low-resistance state. The low-resistance state of the MTJ element 30 is defined as, for example, "0".

On the other hand, if a write current from the reference layer 35 toward the memory layer 33 is passed to the MTJ element 30, the relative relation of magnetization of the memory layer 33 and the reference layer 35 becomes anti-parallel. In the anti-parallel state, the resistance value of the MTJ element 30 is the highest and the MTJ element 30 is set to the high-resistance state. The high-resistance state of the MTJ element 30 is defined as, for example, "1".

Accordingly, the MTJ element 30 can be used as a memory element capable of storing 1-bit data (binary data). The allocation of the resistance state and data of the MTJ element 30 can be set arbitrarily.

When data is read from the MTJ element 30, a read voltage is applied to the MTJ element 30 and the resistance value of the MTJ element 30 is detected based on a read current flowing into the MTJ element 30 at this point. The read current is set to a sufficiently smaller value than the threshold of magnetization reversal by the spin injection (spin transfer).

As shown in FIG. 2, a first memory cell group (including the memory cells MC1, MC2) included in the first column and a second memory cell group (including the memory cells MC3, MC4) included in the second column adjacent to the first column share the bit line BL2.

FIG. 4 is a schematic diagram showing another configuration example of the memory cell array 11. In the memory cell array 11, eight word lines WL1 to WL8 extending in the row direction, nine bit lines BL1 to BL9 extending in the column direction, and eight source lines SL1 to SL8 extending in the column direction are arranged. In FIG. 4, the memory cell MC is indicated by an ellipse in a simplified manner. The circuit configuration of the memory cell MC is the same as that in FIG. 2.

One column is connected to two bit lines BL and one source line SL. Two columns adjacent in the row direction share one bit line BL. The source line SL is provided for each column.

The word lines WL1, WL3 can be selected by the same row address R1. The word lines WL2, WL4 can be selected by the same row address R2. The word lines WL5, WL7 can be selected by the same row address R3. The word lines WL6, WL8 can be selected by the same row address R4. That is the memory cell array in FIG. 4 is configured by 32 cells of four rows/eight columns.

The column select circuit 12 selects, for example, one column. The two bit lines BL and one source line SL connected to the selected column are connected to the sense amplifier 13 and the write driver 14 via two global bit lines GBL, /GBL and one global source line GSL.

[1-2] Operation of Memory Cell MC

Next, the operation of the memory cell MC will be described. First, the write operation of the memory cell MC will be described. FIGS. 5A and 5B are diagrams illustrating the write operation of the memory cell MC. In FIGS. 5A and 5B, a bit line pair connected to one memory cell is denoted as BL, /BL.

The word line WL, the bit lines BL, /BL, and the source line SL are connected to the memory cell MC. The reference layer (RL) 35 of the MTJ element 30-1 is connected to the bit line BL and the reference layer (RL) 35 of the MTJ element 30-2 is connected to the bit line /BL.

In the write operation, a positive write voltage Vw is applied to one of the bit lines BL, /BL and a ground voltage (0 V) is applied to the other and also a voltage (intermediate voltage) Vm between the write voltage Vw and 0 V is applied to the source line SL. The intermediate voltage Vm can be set to any voltage between the write voltage Vw and 0 V. By changing the intermediate voltage Vm, the voltage applied to the MTJ element 30-1 and the voltage applied to the MTJ element 30-2 can be made equal or different. The intermediate voltage Vm can appropriately be set in accordance with characteristics of the MTJ element.

FIG. 5A is a diagram illustrating an operation to write "0" data into the memory cell MC. To write "0", 0 V is applied to the bit line BL, the write voltage Vw (for example, 1.8 V) is applied to the bit line /BL, and the intermediate voltage Vm (for example, 0.8 V) is applied to the source line SL. A high-level voltage capable of turning on the select transistors 31-1, 31-2 is applied to the word line WL.

In this case, a write current from the memory layer 33 toward the reference layer 35 passes through the MTJ element 30-1 to write "0" data. A write current from the reference layer 35 toward the memory layer 33 passes through the MTJ element 30-2 to write "1" data. That is, the MTJ elements 30-1, 30-2 store complementary data. For example, data stored in the memory cell MC is made to correspond to data stored in the MTJ element 30-1.

In the write operation, 0.8 V is applied to the MTJ element 30-1 written into the low-resistance state by the source line SL and the bit line BL. 1.0 V is applied to the MTJ element 30-2 written into the high-resistance state by the bit line /BL and the source line SL. That is, voltages suitable for data writing can be applied to the MTJ elements 30-1, 30-2.

FIG. 5B is a diagram illustrating an operation to write "1" data into the memory cell MC. To write "1", the write voltage Vw (for example, 1.8 V) is applied to the bit line BL, 0 V is applied to the bit line /BL, and the intermediate voltage Vm (for example, 0.8 V) is applied to the source line SL.

In this case, a write current from the reference layer 35 toward the memory layer 33 passes through the MTJ element 30-1 to write "1" data. A write current from the memory layer 33 toward the reference layer 35 passes through the MTJ element 30-2 to write "0" data.

Next, the read operation of the memory cell MC will be described. FIGS. 6A and 6B are diagrams illustrating the read operation of the memory cell MC.

In the read operation, a positive read voltage Vr (for example, 0.6 V) is applied to both bit lines BL, /BL and also 0 V is applied to the source line SL. Accordingly, a current determined by the resistance state of the MTJ element 30-1 flows to the bit line BL and a current determined by the resistance state of the MTJ element 30-2 flows to the bit line /BL. The sense amplifier 13 reads data of the memory cell MC by detecting a difference of the current flowing to the bit line BL and the current flowing to the bit line /BL.

FIG. 6A is a diagram illustrating a read operation of the memory cell MC storing "0" data. The memory cell MC storing "0" data has "0" data stored in the MTJ element 30-1 and "1" data stored in the MTJ element 30-2. When "0" is read, the MTJ element 30-1 is in a low-resistance state and the MTJ element 30-2 is in a high-resistance state and thus, the current flowing to the MTJ element 30-1 is larger than the current flowing to the MTJ element 30-2. The difference of the currents is detected by the sense amplifier 13.

FIG. 6B is a diagram illustrating the read operation of the memory cell MC storing "1" data. The memory cell MC storing "1" data has "1" data stored in the MTJ element 30-1 and "0" data stored in the MTJ element 30-2. When "1" is read, the MTJ element 30-1 is in a high-resistance state and the MTJ element 30-2 is in a low-resistance state and thus, the current flowing to the MTJ element 30-1 is smaller than the current flowing to the MTJ element 30-2. The difference of the currents is detected by the sense amplifier 13.

[2] Layout and Structure of Memory Cell MC

Figure 7:
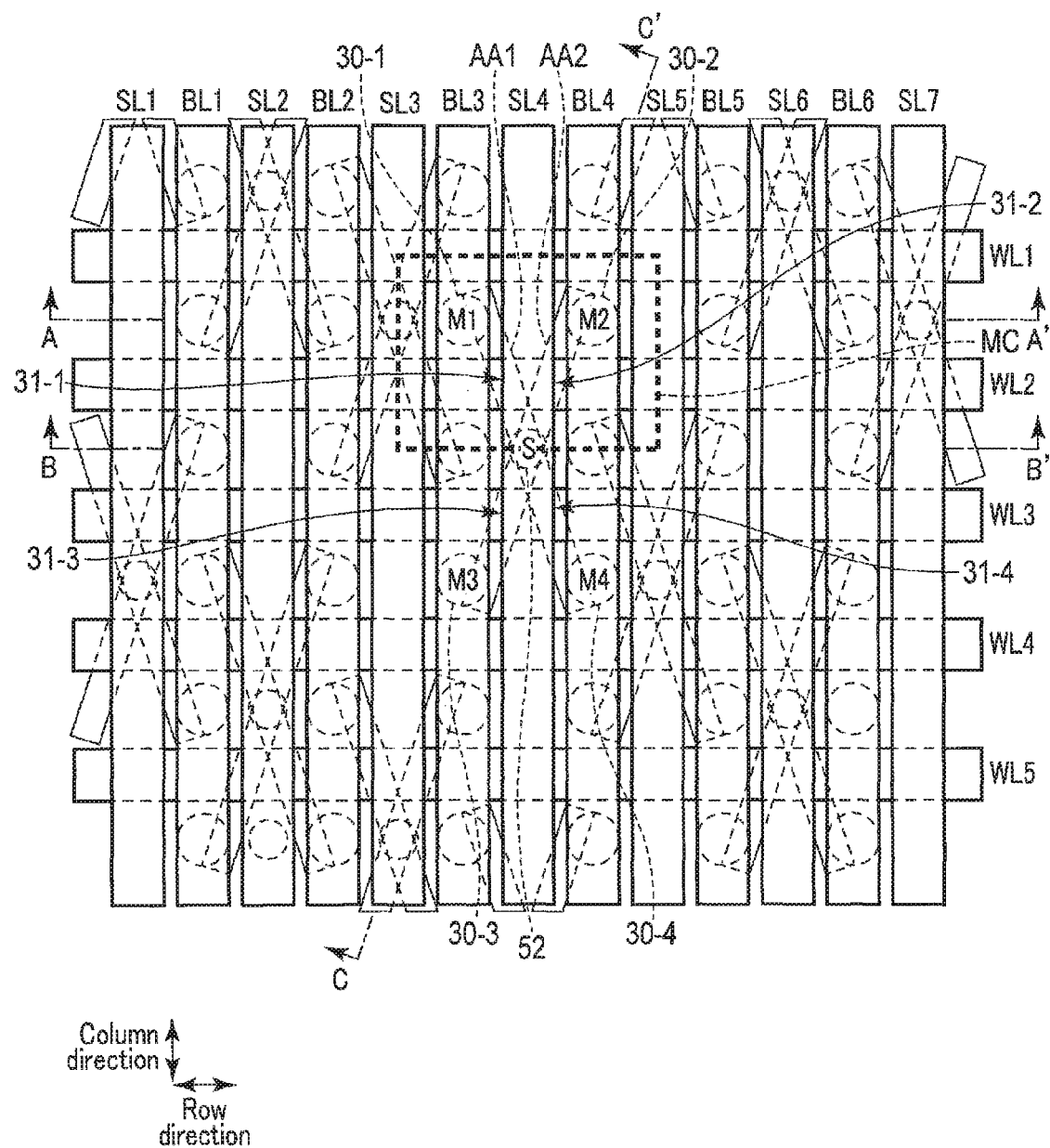
FIG. 7 is a plan view of the memory cell array.
Figure 8:
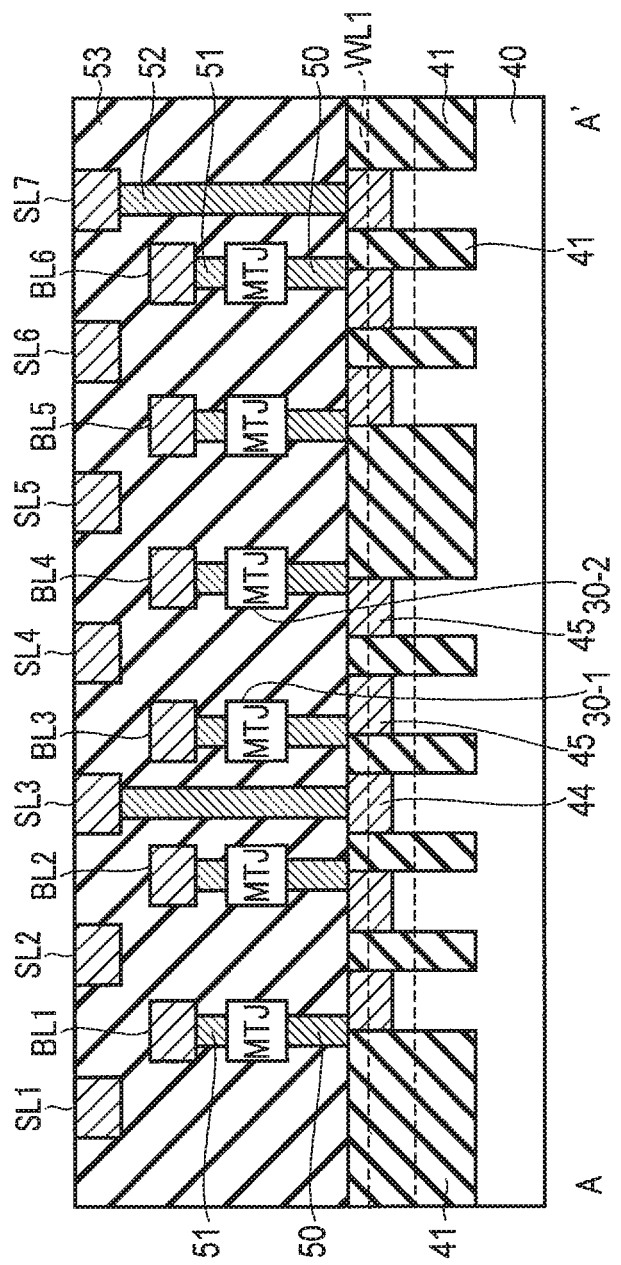
FIG. 8 is a sectional view of the memory cell array along an A-A' line shown in FIG. 7.
Figure 9:
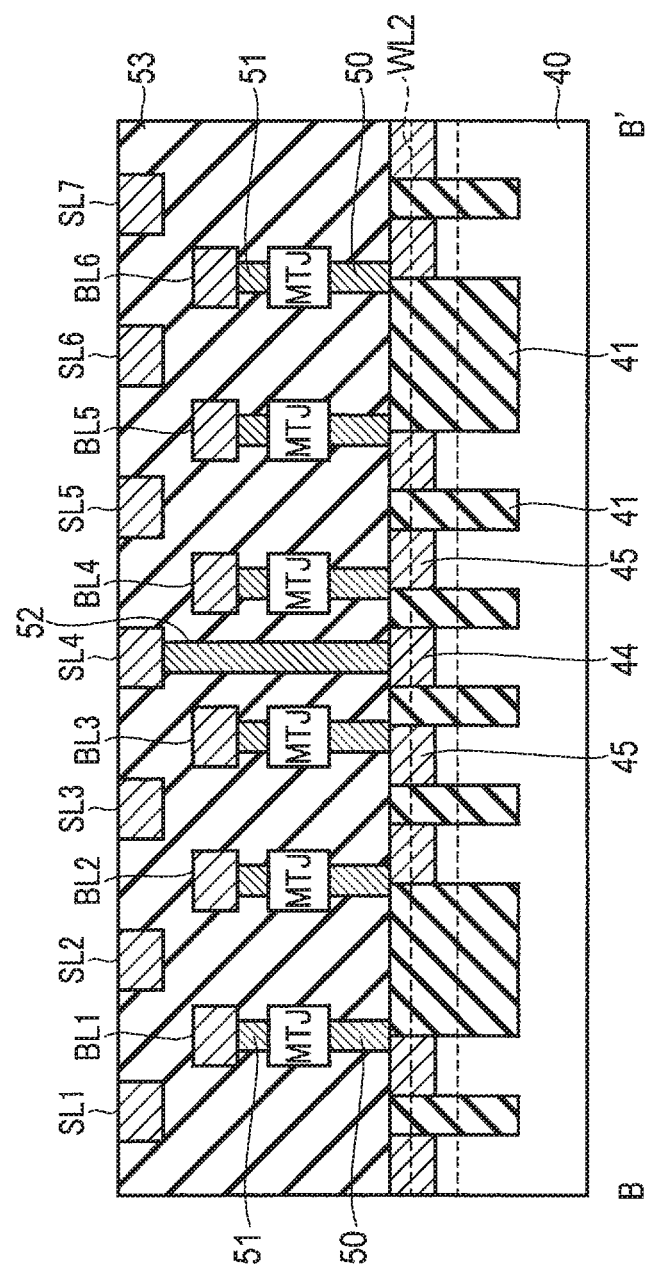
FIG. 9 is a sectional view of the memory cell array along a B-B' line shown in FIG. 7.
Figure 10:
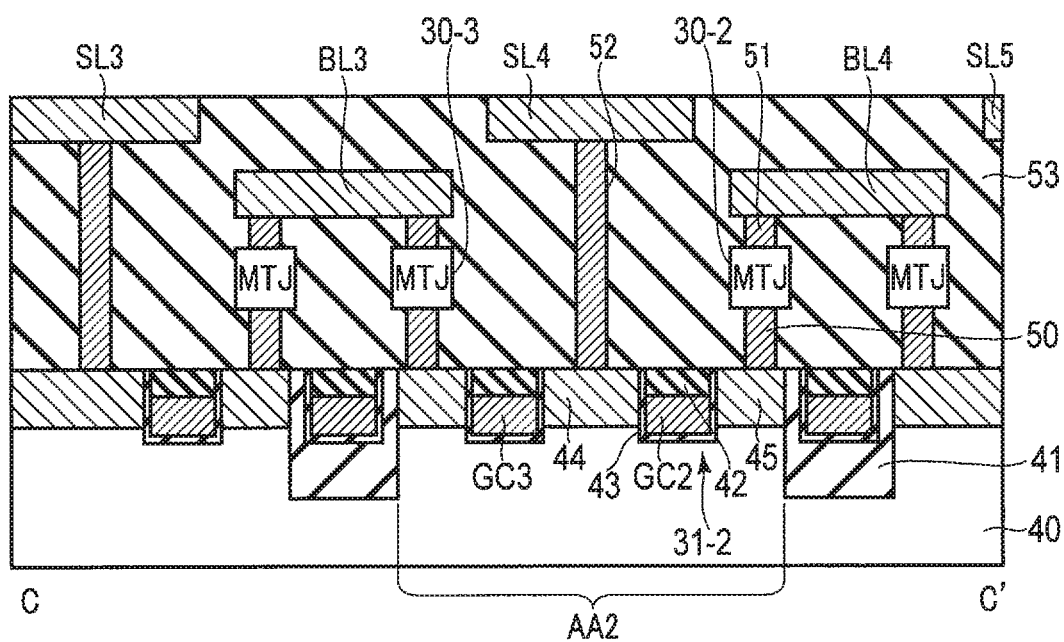
FIG. 10 is a sectional view of the memory cell array along a C-C' line shown in FIG. 7.

Next, the layout and structure of the memory cell MC will be described. FIG. 7 is a plan view of the memory cell array 11. FIG. 8 is a sectional view of the memory cell array 11 along an A-A' line in FIG. 7. FIG. 9 is a sectional view of the memory cell array 11 along a B-B' line in FIG. 7. FIG. 10 is a sectional view of the memory cell array 11 along a C-C' line in FIG. 7.

A semiconductor substrate 40 is formed of a P-type semiconductor substrate. The P-type semiconductor substrate may be a P-type semiconductor region (P-type well) provided in a semiconductor substrate. The semiconductor substrate 40 is provided with a first active area AA1 tilted by +α degrees with respect to the column direction and a second active area AA2 tilted by $-\alpha$ degrees with respect to the column direction "$\alpha$" is $0<\alpha<90°$. Particularly preferably, "$\alpha$" is $15°<\alpha<25°$.

The first active area AA1 and the second active area AA2 intersect in the centers thereof. That is, the first active area AA1 and the second active area AA2 form an X-shape in a plan view. In other words, in FIG. 7, an upper portion of the first active area AA1 and that of the second active area AA2 form a V-shape and a lower portion of the first active area AA1 and that of the second active area AA2 form an inverted V-shape.

A element isolation region 41 is provided around the active areas AA1, AA2. That is, a region of a surface region of the semiconductor substrate 40 in which the element isolation region 41 is not formed is an active area. The element isolation region 41 is formed of, for example, STI (Shallow Trench Isolation). That is, the element isolation region 41 is formed by forming a trench of the semiconductor substrate 40 and filling up the trench with an insulator.

Two select transistors 31-1, 31-4 are provided in the active area AA1. Similarly, two select transistors 31-2, 31-3 are provided in the active area AA2.

Hereinafter, the structure of a select transistor will be described by taking the select transistor 31-2 shown in FIG. 10 as an example. The select transistor 31-2 has a buried gate structure. However, the gate of a select transistor is not limited to the buried gate structure and may be formed from a gate electrode provided on the semiconductor substrate via a gate insulating film. The select transistor 31-2 comprises a gate electrode GC2, a cap layer 42, a gate insulating film 43, a source region 44, and a drain region 45. The gate electrode GC2 functions as the word line WL2.

The gate electrode GC2 extends in the row direction and is buried in the semiconductor substrate 40. The top surface of the gate electrode GC2 is deeper than that of the semiconductor substrate 40. The cap layer 42 made of an insulator (for example, silicon nitride (SiN)) is provided on the gate electrode GC2. The gate insulating film 43 is provided on the bottom surface and both side surfaces of the gate electrode GC2. The source region 44 and the drain region 45 are provided on both sides of the gate electrode GC2 inside the active area AA2. The source region 44 and the drain region 45 is formed of an $N^+$ type diffusion region formed by doping the semiconductor substrate 40 with high-concentration N type impurities.

A contact plug 50 is provided in the drain region 45 and the MTJ element 30-2 is provided on the contact plug 50. A via plug 51 is provided on the MTJ element 30-2 and the bit line BL4 extending in the column direction is provided on the via plug 51.

A contact plug 52 is provided in the source region 44 and the source line SL4 extending in the column direction is provided on the contact plug 52. For example, the source line SL is formed of a wiring layer higher than that of the bit line BL. An interlayer dielectric layer 53 is provided between the semiconductor substrate 40 and the source line SL.

As shown in FIG. 7, the contact plug 52(S) connected to the source region 44 is arranged in an intersection region of the first active area AA1 and the second active area AA2 forming an X-shape, the MTJ element 30-1(M1) is arranged on one end of the first active area AA1, and the MTJ element 30-2(M2) is arranged on one end of the second active area AA2. That is, the MTJ elements 30-1, 30-2 and the contact plug 52 are arranged in a V-shaped portion of the first active area AA1 and the second active area AA2.

In the present embodiment, a configuration example in which the MTJ element is arranged on one end of an active area is illustrated, but the arrangement of the MTJ element is not limited to the above arrangement. For example, the MTJ element may be arranged near an end of the active area. It may have a positional relationship in which a contact (corresponding to the reference sign 50 in FIG. 10) connecting an MTJ element and a drain region is arranged between the word lines WL.

Similarly, the MTJ element 30-4(M4) is arranged on the other end of the first active area AA1 and the MTJ element 30-3(M3) is arranged on the other end of the second active area AA2. That is, the MTJ elements 30-3, 30-4 and the contact plug 52 are arranged in an inverted V-shaped portion of the first active area AA1 and the second active area AA2.

In the configuration example of FIG. 7, one memory cell MC is configured by the MTJ elements 30-1, 30-2 and the select transistors 31-1, 31-2. The select transistor 31-1 is provided in the first active area AA1. The select transistor 31-2 is provided in the second active area AA2.

One end of the MTJ element 30-1 is connected to the bit line BL3 and the other end thereof is connected to the drain region 45 of the select transistor 31-1. The gate of the select transistor 31-1 is connected to the word line WL2 and the source region 44 thereof is connected to the source line SL4.

One end of the MTJ element 30-2 is connected to the bit line BL4 and the other end thereof is connected to the drain region 45 of the select transistor 31-2. The gate of the select transistor 31-2 is connected to the word line WL2 and the source region 44 thereof is connected to the source line SL4.

[3] Cell Size

Figure 12:
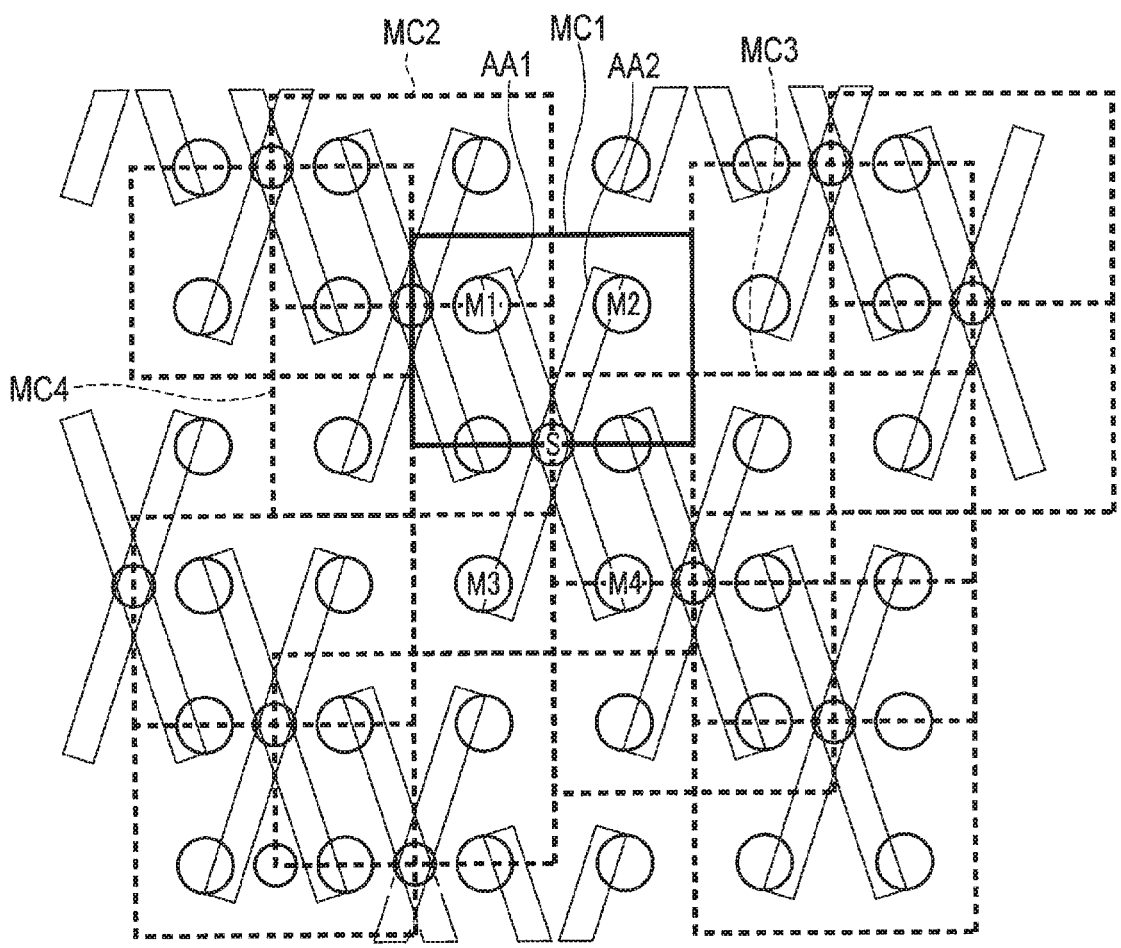
FIG. 12 is a plan view extracting an active area and the MTJ element.

FIG. 11 is a plan view of the memory cell array illustrating a cell size. FIG. 12 is a plan view extracting an active area and the MTJ element.

The memory cell concerned is denoted as MC1. "F" is the minimum feature size using lithography technology and etching technology. The region where the memory cell MC1 is arranged is represented by a solid-line quadrangle shown in FIGS. 11 and 12 and the size thereof is $12F^2$ ($=4F \times 3F$).

The memory cell MC1 has a region partially overlapping with the neighboring memory cells MC2 to MC4. A region where the memory cell MC1 and the memory cell MC2 overlap has a size of $2F^2$ ($=2F \times 1F$). A region where the memory cell MC1 and the memory cell MC3 overlap has a size of $2F^2$ ($=2F \times 1F$). A region where the memory cell MC1 and the memory cell MC4 overlap has a size of $4F^2$ ($=2F \times 2F$).

Thus, the substantial cell size of the memory cell MC1 is determined by subtracting half the area of the region partially overlapping with the neighboring memory cells MC2 to MC4 from $12F^2$. That is, the cell size of the memory cell MC1 is given by $12F^2-(2F^2+2F^2+4F^2)/2=8F^2$. Thus, in the present embodiment, the memory cell MC whose cell size is $8F^2$ can be realized.

[4] Effect

In the present embodiment, as described above, the semiconductor substrate 40 is provided with the first active area AA1 and the second active area AA2 tilted to both sides with respect to the column direction. The first active area AA1 and the second active area AA2 intersect with each other to form an X-shape. One memory cell MC is arranged in a V-shaped region of the first active area AA1 and the second active area AA2 and the other memory cell MC is arranged in an inverted V-shaped region of the first active area AA1 and the second active area AA2.

The memory cell MC comprises the two MTJ elements 30-1, 30-2 and the two select transistors 31-1, 31-2. The select transistors 31-1, 31-2 share the source region 44 provided in the intersection region of the first active area AA1 and the second active area AA2 and the gates thereof are connected to a common word line. One end of the MTJ element 30-1 is connected to the drain region 45 of the select transistor 31-1 and the other end thereof is connected to the bit line BL. One end of the MTJ element 30-2 is connected to the drain region 45 of the select transistor 31-2 and the other end thereof is connected to the bit line /BL. The source region 44 is connected to the source line SL. Further, the MTJ elements 30-1, 30-2 store complementary data.

Normally, when data is read from one MTJ element, a reference cell for reading set to an intermediate resistance value of "0" data and "1" data is needed. In the present embodiment, however, data can be read from the memory cell MC using the MTJ elements 30-1, 30-2 storing complementary data. Accordingly, the sense margin can be increased so that data can correctly be read from the memory cell MC. Further, even if the rate of resistance change (MR ratio) is small between the low-resistance state and the high-resistance state in an MTJ element, data can correctly be read from the memory cell MC. In addition, data holding characteristics are excellent and a high-reliability MRAM can be realized.

Because no reference cell is needed, data reading is not affected by characteristic variations of the reference cell. Accordingly, a high-reliability MRAM can be realized. In addition, an area to arrange a reference cell can be reduced and thus, an increase in MRAM area can be limited.

Also, one memory cell MC is formed in V-shaped active areas and the select transistors 31-1, 31-2 share the source region 44. Accordingly, the cell size of $8F^2$ can be realized. As a result, while an increase in cell size is limited, a high-reliability MRAM can be realized.

Incidentally, the MRAM illustrated in the above embodiment may be an STT-MRAM (spin-transfer torque magnetoresistive random access memory) using the spin injection (spin transfer) phenomenon for magnetization reversal of a magnetic layer.

In the above embodiment, the semiconductor memory device is described by taking the MRAM using a magnetoresistive effect element as an example, but the present invention is not limited to the above example and can be applied to various kinds of semiconductor memory devices, regardless of volatile or nonvolatile. Also, the present invention can be applied to resistance change type memories like the MRAM, for example, an ReRAM (Resistive Random Access Memory), a PCRAM (Phase-Change Random Access Memory) and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first active area provided in a semiconductor substrate and extending in a first direction;
    a second active area provided in the semiconductor substrate and extending from an end of the first active area in a second direction intersecting the first direction;
    a first select transistor comprising a first drain region provided in the first active area and a first source region provided in an intersection region of the first and second active areas;
    a second select transistor comprising a second drain region provided in the second active area and sharing the first source region;
    a first word line coupled to gates of the first and second select transistors;
    first and second variable resistance elements coupled to the first and second drain regions, respectively;
    a first bit line coupled to the first variable resistance element;
    a second bit line coupled to the second variable resistance element; and
    a first source line coupled to the first source region.

2. The device of claim 1, wherein the second variable resistance element stores complementary data of the first variable resistance element.

3. The device of claim 1, wherein
    the first active area is tilted relative to a third direction in which the first bit line extends, and
    the second active area is tilted to an opposite side of the first active area relative to the third direction.

4. The device of claim 1, wherein
    the first variable resistance element is arranged near an end of the first active area, and
    the second variable resistance element is arranged near the end of the second active area.

5. The device of claim 1, wherein
    the first and second bit lines and the first source line extend in a third direction intersecting the first and second directions,
    the first source line is arranged between the first and second bit lines, and
    the first word line extends in a fourth direction intersecting the first to third directions.

6. The device of claim 1, further comprising a controller that applies a first voltage to the first bit line, applies a second voltage to the second bit line, and applies a third voltage between the first voltage and the second voltage to the first source line in a write operation.

7. The device of claim 1, further comprising a controller that applies a first voltage to the first and second bit lines and applies a second voltage to the first source line in a read operation.

8. The device of claim 1, further comprising:
    a third active area provided in the semiconductor substrate and extending in the first direction;
    a fourth active area provided in the semiconductor substrate and extending from an end of the third active area in the second direction;
    a third select transistor comprising a third drain region provided in the third active area and a second source region provided in an intersection region of the third and fourth active areas;
    a fourth select transistor comprising a fourth drain region provided in the fourth active area and sharing the second source region;
    a second word line coupled to gates of the third and fourth select transistors;
    a third variable resistance element coupled to the third drain region and the second bit line;
    a fourth variable resistance element coupled to the fourth drain region;

a third bit line coupled to the fourth variable resistance element; and a second source line coupled to the second source region.

9. The device of claim 1, wherein each of the first and second variable resistance elements is a magnetoresistive element.

10. A semiconductor memory device comprising:
a first active area provided in a semiconductor substrate and extending in a first direction;
a second active area provided in the semiconductor substrate, intersecting the first active area, and extending in a second direction intersecting the first direction;
a first select transistor comprising a first drain region provided in the first active area and a source region provided in an intersection region of the first and second active areas;
a second select transistor comprising a second drain region provided in the second active area and sharing the source region;
a third select transistor comprising a third drain region provided in the second active area and sharing the source region;
a fourth select transistor comprising a fourth drain region provided in the first active area and sharing the source region;
a first word line coupled to gates of the first and second select transistors;
a second word line coupled to the gates of the third and fourth select transistors;
first to fourth variable resistance elements coupled to the first to fourth drain regions, respectively;
a first bit line coupled to the first and third variable resistance elements;
a second bit line coupled to the second and fourth variable resistance elements; and
a source line coupled to the source region.

11. The device of claim 10, wherein
the second variable resistance element stores complementary data of the first variable resistance element, and
the fourth variable resistance element stores complementary data of the third variable resistance element.

12. The device of claim 10, wherein
the first active area is tilted relative to a third direction in which the first bit line extends, and
the second active area is tilted to an opposite side of the first active area relative to the third direction.

13. The device of claim 10, wherein
the first variable resistance element is arranged near one end of the first active area,
the second variable resistance element is arranged near the one end of the second active area,
the third variable resistance element is arranged near the other end of the second active area, and
the fourth variable resistance element is arranged near the other end of the first active area.

14. The device of claim 10, wherein
the first and second bit lines and the source line extend in a third direction,
the source line is arranged between the first and second bit lines, and
the first and second word lines extend in a fourth direction intersecting the third direction.

15. The device of claim 10, further comprising a controller that applies a first voltage to the first bit line, applies a second voltage to the second bit line, and applies a third voltage between the first voltage and the second voltage to the source line in a write operation.

16. The device of claim 10, further comprising a controller that applies a first voltage to the first and second bit lines and applies a second voltage to the source line in a read operation.

17. A semiconductor memory device comprising:
a first active area provided in a semiconductor substrate and extending in a first direction;
a second active area provided in the semiconductor substrate and extending from an end of the first active area in a second direction intersecting the first direction;
a first select transistor provided in the first active area;
a second select transistor provided in the second active area;
a first variable resistance element coupled to the first select transistor; and
a second variable resistance element coupled to the second select transistor and storing complementary data of the first variable resistance element.

18. The device of claim 17, further comprising:
a word line coupled to gates of the first and second select transistors;
a first bit line coupled to the first variable resistance element;
a second bit line coupled to the second variable resistance element; and
a source line coupled to a source region shared by the first and second select transistors.

19. The device of claim 18, wherein
the first active area is tilted relative to a third direction in which the first bit line extends, and
the second active area is tilted to an opposite side of the first active area relative to the third direction.

20. The device of claim 18, wherein
the first and second bit lines and the source line extend in a third direction intersecting the first and second directions,
the source line is arranged between the first and second bit lines, and
the word line extends in a fourth direction intersecting the first to third directions.

* * * * *